(12) United States Patent
Coolbaugh et al.

(10) Patent No.: US 7,335,927 B2
(45) Date of Patent: Feb. 26, 2008

(54) LATERAL SILICIDED DIODES

(75) Inventors: Douglas Duane Coolbaugh, Essex Junction, VT (US); Jeffrey Bowman Johnson, Essex Junction, VT (US); Xuefeng Liu, South Burlington, VT (US); Bradley Alan Orner, Fairfax, VT (US); Robert Mark Rassel, Colchester, VT (US); David Charles Sheridan, Williston, VT (US)

(73) Assignee: Internatioanl Business Machines Corporation, Armonk, NY (US)

( * ) Notice: Subject to any disclaimer, the term of this patent is extended or adjusted under 35 U.S.C. 154(b) by 168 days.

(21) Appl. No.: 11/275,794

(22) Filed: Jan. 30, 2006

(65) Prior Publication Data

US 2007/0176252 A1    Aug. 2, 2007

(51) Int. Cl.
*H01L 21/8238* (2006.01)
(52) U.S. Cl. .............. 257/104; 257/577; 257/624; 257/E27.016; 257/E27.013; 257/E27.051; 257/E27.073; 257/E29.329; 257/E21.053; 257/E21.358; 257/E21.366; 438/237
(58) Field of Classification Search ................ 257/104, 257/577, 624, E27.016, E27.013, E27.051, 257/E27.073, E29.329, E21.053, E21.358, 257/E21.366; 438/237, FOR. 415
See application file for complete search history.

(56) References Cited

U.S. PATENT DOCUMENTS

| | | | |
|---|---|---|---|
| 4,589,193 A * | 5/1986 | Goth et al. ................. | 438/430 |
| 4,847,670 A * | 7/1989 | Monkowski et al. ....... | 257/586 |
| 5,874,341 A * | 2/1999 | Gardner et al. ............ | 438/301 |
| 6,005,272 A * | 12/1999 | Gardner et al. ............ | 257/344 |
| 6,177,289 B1 | 1/2001 | Crow et al. | |
| 6,429,500 B1 | 8/2002 | Greenberg et al. | |
| 6,433,396 B1 | 8/2002 | Kinzer | |
| 6,451,702 B1 | 9/2002 | Yang et al. | |
| 6,538,299 B1 | 3/2003 | Kwark et al. | |
| 6,667,528 B2 | 12/2003 | Cohen et al. | |
| 6,730,971 B2 * | 5/2004 | Hwang et al. ............. | 257/371 |
| 6,806,548 B2 | 10/2004 | Shirai et al. | |
| 6,825,105 B2 | 11/2004 | Grover et al. | |
| 6,855,593 B2 | 2/2005 | Andoh et al. | |
| 6,943,409 B1 | 9/2005 | Cheng et al. | |
| 7,074,683 B2 * | 7/2006 | Hwang et al. ............. | 438/300 |
| 7,256,112 B2 * | 8/2007 | Chong et al. .............. | 438/593 |
| 2002/0115300 A1 | 8/2002 | Yang et al. | |
| 2003/0111708 A1 * | 6/2003 | Hwang et al. ............. | 257/514 |
| 2004/0007723 A1 | 1/2004 | Andoh et al. | |
| 2005/0173739 A1 | 8/2005 | Kusumoto et al. | |
| 2006/0043474 A1 * | 3/2006 | Kinzer et al. .............. | 257/330 |
| 2007/0176252 A1 * | 8/2007 | Coolbaugh et al. ........ | 257/458 |

FOREIGN PATENT DOCUMENTS

| JP | 6196683 A | 7/1994 |
|---|---|---|
| JP | 2002203966 A | 7/2002 |

* cited by examiner

*Primary Examiner*—George Fourson
(74) *Attorney, Agent, or Firm*—Schmeiser, Olsen & Watts; Anthony J. Canale

(57) ABSTRACT

A structure and method of fabricating lateral diodes. The diodes include Schottky diodes and PIN diodes. The method of fabrication includes forming one or more doped regions and more trenches in a silicon substrate and forming metal silicides on the sidewalls of the trenches. The fabrication of lateral diodes may be integrated with the fabrication of field effect, bipolar and SiGe bipolar transistors.

18 Claims, 14 Drawing Sheets

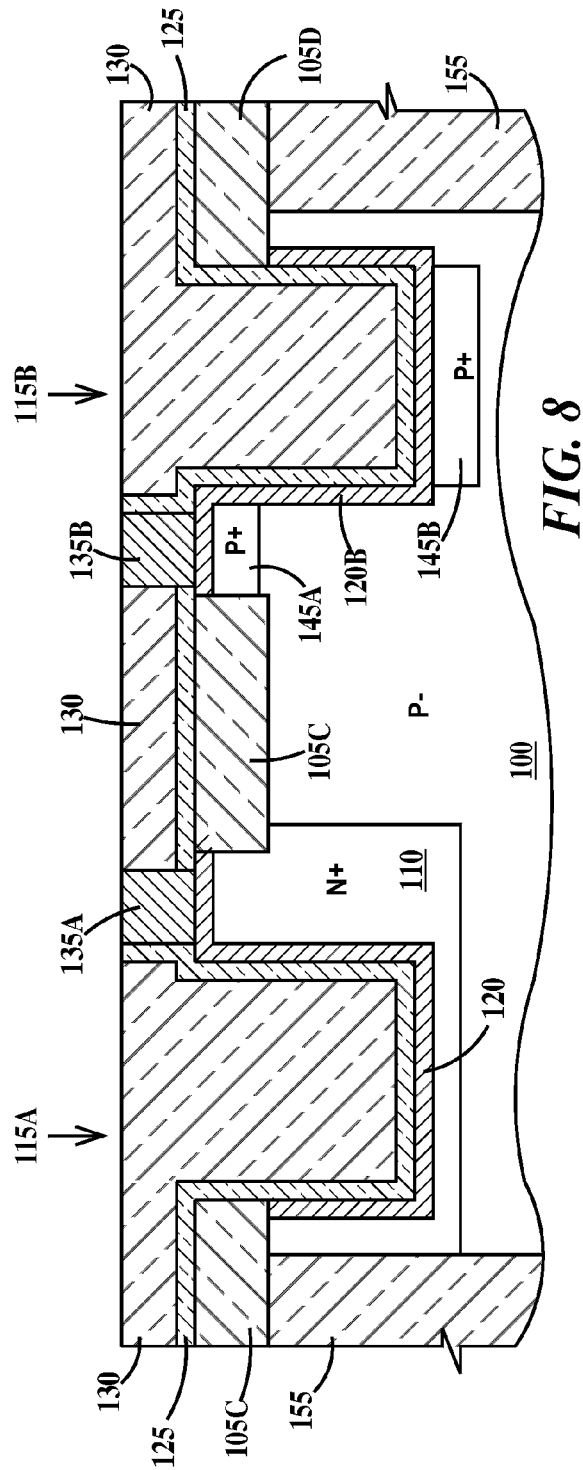
FIG. 8
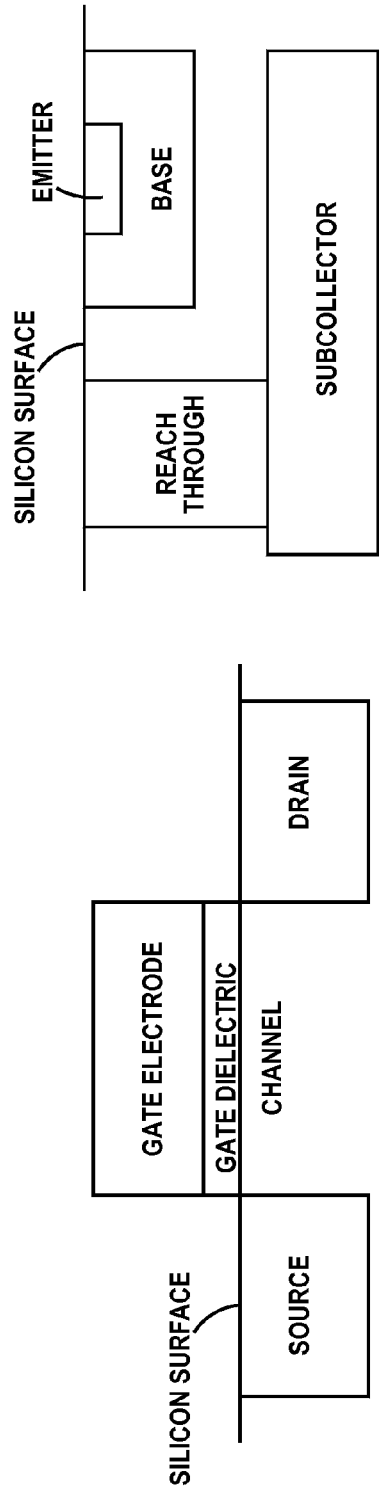
FIG. 9A
FIG. 9B

LATERAL SILICIDED DIODES

FIELD OF THE INVENTION

The present invention relates to the field of semiconductor devices; more specifically, it relates to structures and methods of fabricating Schottky barrier and PIN diodes.

BACKGROUND OF THE INVENTION

Schottky barrier diodes are particularly sensitive to reverse bias-leakage and PIN (P-doped-Intrinsic-N-doped) diodes are not well suited for high frequency applications because the structure and fabrication methods do not allow an amount of control of dopant levels needed for robust low-leakage and high frequency devices. These problems are even more severe when Schottky barrier and PIN diodes are integrated into fabrication methodologies designed to optimize the performance of complimentary metal-oxide-silicon (CMOS) and bipolar (including SiGe) transistors and in CMOS, bipolar and BiCMOS technologies. This leads to poor performance of the circuits utilizing Schottky barrier and PIN diodes.

Therefore, there is a need for improved Schottky barrier and PIN diodes, methods of fabricating improved Schottky barrier and PIN diodes and methods of integrating improved Schottky barrier and PIN diodes into CMOS, bipolar and BiCMOS technologies.

SUMMARY OF THE INVENTION

A first aspect of the present invention is a diode, comprising: a doped region having opposite first and second sides, the doped region extending from a top surface of a silicon substrate a first distance into the substrate; a trench having opposite first and second sidewalls and extending from the top surface of the substrate a second distance into the substrate, the first sidewall of the trench separated from the first side of the doped region by a dielectric region extending from the top surface of the substrate a third distance into the substrate and by a region of the substrate under the dielectric region and between the first side of the doped region and the first sidewall of the trench, the third distance less than the first or second distances; and a first region of a metal silicide layer on the first sidewall of the trench and a second region of the metal silicide layer on a top surface of the doped region, the first and second regions of the metal silicide layer electrically isolated from each other by the dielectric region.

A second aspect of the present invention is the first aspect further including: dielectric layer filling the trench and covering the metal silicide layer and the dielectric region; a first electrically conductive contact extending from a top surface of the dielectric layer, through the dielectric layer to the first region of the metal silicide layer, the first electrically conductive contact in direct physical and electrical contact with the first region of the metal silicide layer; and a second electrically conductive contact extending from the top surface of the dielectric layer, through the dielectric layer to the second region of the metal silicide layer, the second electrically conductive contact in direct physical and electrical contact with the second region of the metal silicide layer.

A third aspect of the present invention is the first aspect, wherein the first region of the metal silicide layer extends over a bottom and the second sidewall of the trench, a region of the top surface of the substrate abutting the second sidewall of the trench.

A fourth aspect of the present invention is the first aspect wherein the dielectric region abuts the first sidewall of the trench.

A fifth aspect of the present invention is the first aspect further including: a first additional doped region extending from the top surface of the substrate a fourth distance into the substrate, the first additional doped region between and abutting both the dielectric region and the first sidewall of the trench; a second additional doped region extending from the bottom of the trench the fourth distance into the substrate, the first additional and second additional doped regions doped to an opposite type from that of the first doped region, a dopant concentration of the first and second additional doped regions at least about 10 times greater than a dopant concentration of the substrate; and the second region of the metal silicide layer extending over exposed surfaces of the first and second additional doped regions.

A sixth aspect of the present invention is the fifth aspect further including: an additional trench having opposite first and second sidewalls and extending from the top surface of the substrate the second distance into the substrate, the first sidewall of the additional trench abutting the second side of the doped region; and the second region of the metal silicide layer extending over the second side of the doped region exposed in the additional trench and over a bottom surface of the additional trench.

A seventh aspect of the present invention is the sixth aspect further including the dielectric layer filling the additional trench.

An eighth aspect of the present invention is the first aspect, further including: an additional trench having opposite first and second sidewalls and extending from the top surface of the substrate the second distance into the substrate, the first sidewall of the additional trench abutting the second side of the doped region; and the second region of the metal silicide layer extending over the second side of the doped region exposed in the second trench and a bottom surface of the additional trench.

A ninth aspect of the present invention is the eighth aspect, further including the dielectric layer filling the additional trench.

A tenth aspect of the present invention is the first aspect, wherein the metal silicide is selected from the group consisting of tungsten silicide, molybdenum silicide, tantalum silicide, cobalt silicide, titanium silicide, nickel silicide and platinum silicide.

An eleventh aspect of the present invention is the first aspect, wherein: the doped region is doped N-type and the substrate is doped P-type or is intrinsic, a concentration of dopant in the doped region at least about 10 times greater than a dopant concentration of the substrate; or the doped region is doped P-type and the substrate is doped N-type or is intrinsic, a concentration of dopant in the doped region at least about 10 times greater than a dopant concentration of the substrate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 8 is a cross-sectional view illustrating a method of further isolating Schottky barrier and PIN diodes according to the various embodiments of the present invention;

FIG. 9A is a simple diagram of a field effect transistor (FET) and FIG. 9B is a simple diagram of a bipolar transistor.

DETAILED DESCRIPTION OF THE INVENTION

While the term intrinsic silicon is often used to mean undoped silicon, in practice this is very difficult to achieve. For the purposes of the present invention intrinsic or undoped silicon may be considered as silicon having a P-type dopant or N-type dopant or a total dopant level of both P and N type dopants of about 1E16 atm/cm$^3$ or less. When a lightly N-type or lightly P-type doped silicon region is described with a dopant concentration of about 1E16 atm/cm$^3$ or less, the region may be considered intrinsic. A region having equal and high dopant concentrations of P and N type dopants is not intrinsic, even though its net dopant concentration may be zero.

Figure 1A:
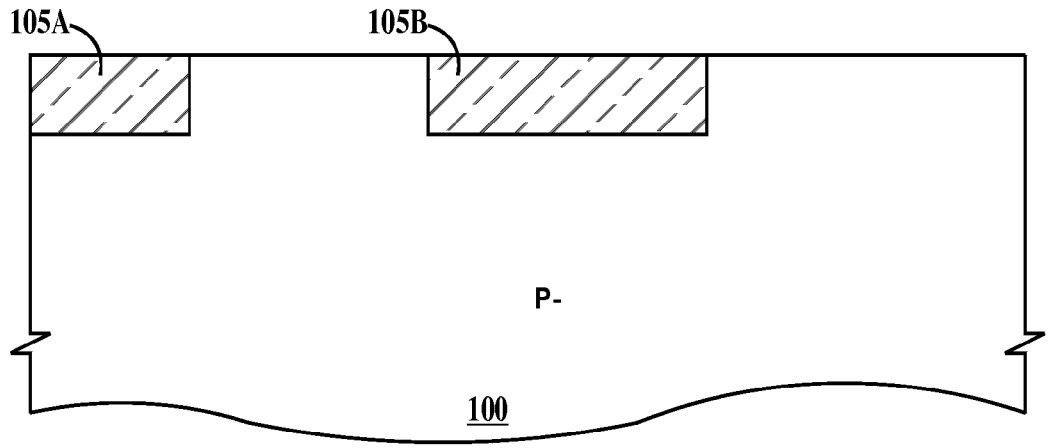
FIGS. 1A through 1E are cross-sectional views illustrating fabrication of a first lateral Schottky barrier diode is according an embodiment of the present invention.

FIGS. 1A through 1E are cross-sectional views illustrating fabrication of a first lateral Schottky barrier diode is according an embodiment of the present invention. In FIG. 1A, formed in a bulk silicon substrate (or alternatively a silicon epitaxial layer) 100 are regions of shallow trench isolation (STI) 105A and 105B. Substrate 100 is lightly doped P-type. In one example, substrate 100 has an average concentration of boron or a boron containing species of about 16 atm/cm$^3$ or less. STI 105A and 105B comprise a dielectric material. In one example, STI comprises a deposited oxide. In one example, STI 105A and 105B may be formed by etching a trench (in one example, by reactive ion etch (RIE)) in substrate 100, depositing a layer of dielectric of sufficient thickness to overfill the trench and then performing a chemical-mechanical-polish (CMP) to remove excess dielectric layer, leaving a top surface of the dielectric layer coplanar with a top surface of the substrate.

Figure 1B:
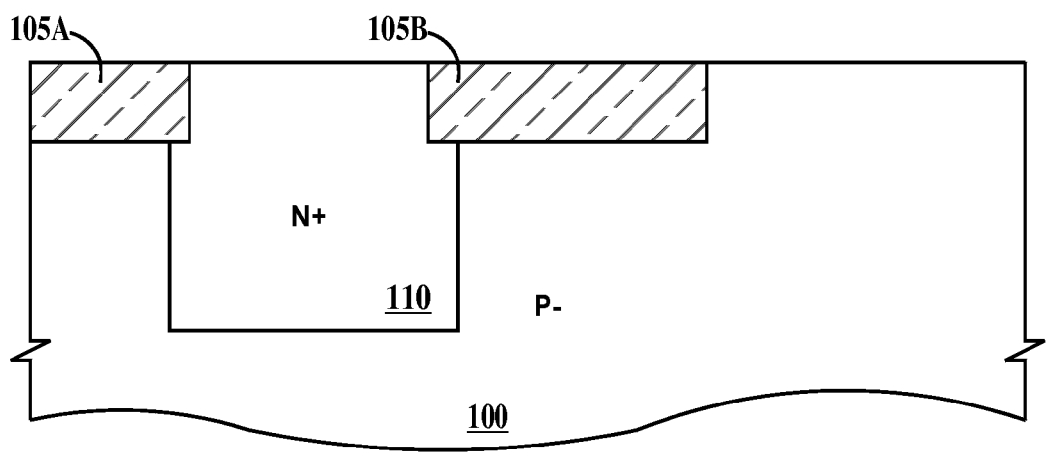

In FIG. 1B a doped region 110 is formed in substrate 100. Doped region 110 is a highly doped N-type. Doped region 110 is bounded by regions of STI 105A and 105B. In one example, doped region 110 has a dopant concentration of between about 1E17 atm/cm$^3$ and about 1E20 atm cm$^3$. In one example, doped region 110 is formed by ion implantation of arsenic or phosphorous. In one example, doped region 110 is formed simultaneously with a reach-through diffusion of an NPN bipolar transistor. In one example, doped region 110 is formed simultaneously with an N-Well diffusion of a p-channel field effect transistor (PFET).

Figure 1C:
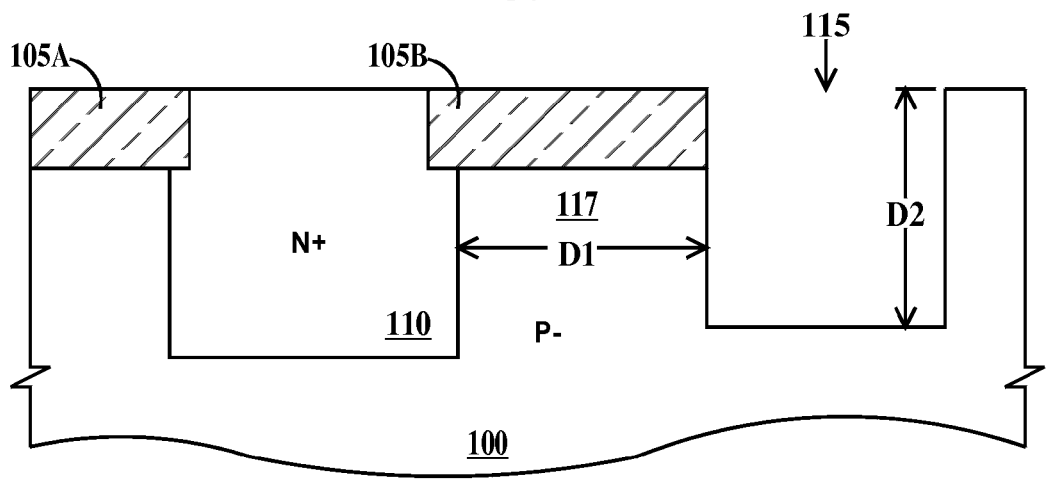

In FIG. 1C, a trench 115 is formed in substrate 115, in one example by RIE. Trench 115 is spaced a distance D1 from doped region 110 and separated from doped region 110 by a region 117 of substrate 100 and region of STI 105B. Trench 115 has a depth D2. In one example D1 is between about 500 nm and about 10000 nm. In one example D2 is between about 500 nm and about 10000 nm. In one example, the ratio of D2/D1 is about 1.5.

Figure 1D:
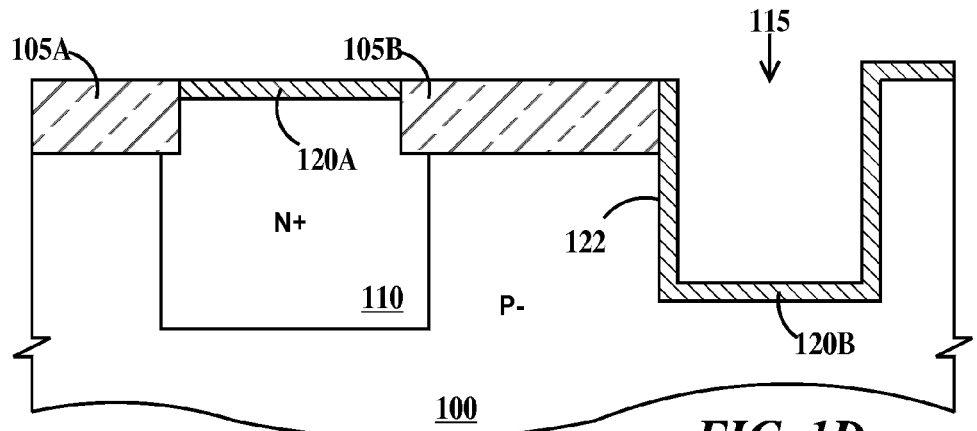

In FIG. 1D, a first metal silicide layer 120A is formed on all exposed surfaces of doped region 110 and a second metal silicide layer 120B is formed over all silicon surfaces exposed in trench 115. Silicide layers 120A and 120B are not in direct physical or electrical contact with each other. Silicide layers 120A and 120B may be formed by depositing or evaporating a blanket layer of metal and heating the substrate in order to cause the metal to react with exposed silicon surfaces to form a metal silicide and then removing any unreacted metal. No metal silicide is formed on STI 105A or 105B. In one example, silicide layers 120A and 120B comprise tungsten silicide, molybdenum silicide, tantalum silicide, cobalt silicide, titanium silicide, nickel silicide or platinum silicide. Silicide layer 120B, on a sidewall 122 of trench 115 (the sidewall of the trench opposing doped region 110) comprises the anode of a Schottky barrier diode, while doped region 110 comprises the cathode of the Schottky barrier diode.

Figure 1E:
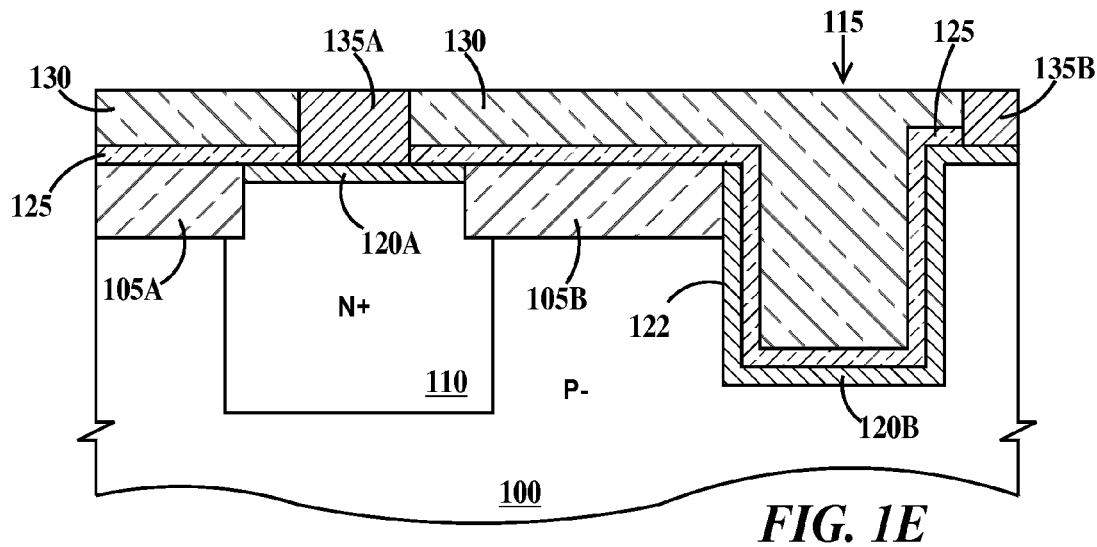

In FIG. 1E, a conformal first dielectric layer 125 is deposited and a second dielectric layer 130 deposited on top of the first dielectric layer. Second dielectric layer 130 is of sufficient thickness to overfill trench 115 (see FIG. 1D). Then, an optional CMP may be performed to planarize the top surface of second dielectric layer 130. A first stud contact 135A is formed to first silicide layer 120A and a second stud contact 135B is formed to second silicide layer 120B. A damascene process may be used to form stud contacts 135A and 135B.

A damascene process is one in which trenches or contact openings are formed in a dielectric layer, an electrical conductor of sufficient thickness to fill the trenches or contacts is deposited on a top surface of the dielectric, and a CMP process is performed to remove excess conductor and make the surface of the conductor co-planer with the surface of the dielectric layer to form a damascene wire or damascene (stud) contact.

In one example, first dielectric layer 125 comprises a layer of silicon nitride over a layer of silicon dioxide. In one example second dielectric layer 130 comprises a layer of borophosphosilicate glass (BPSG). In one example, contacts 135A and 135B comprise tungsten.

Figure 2:
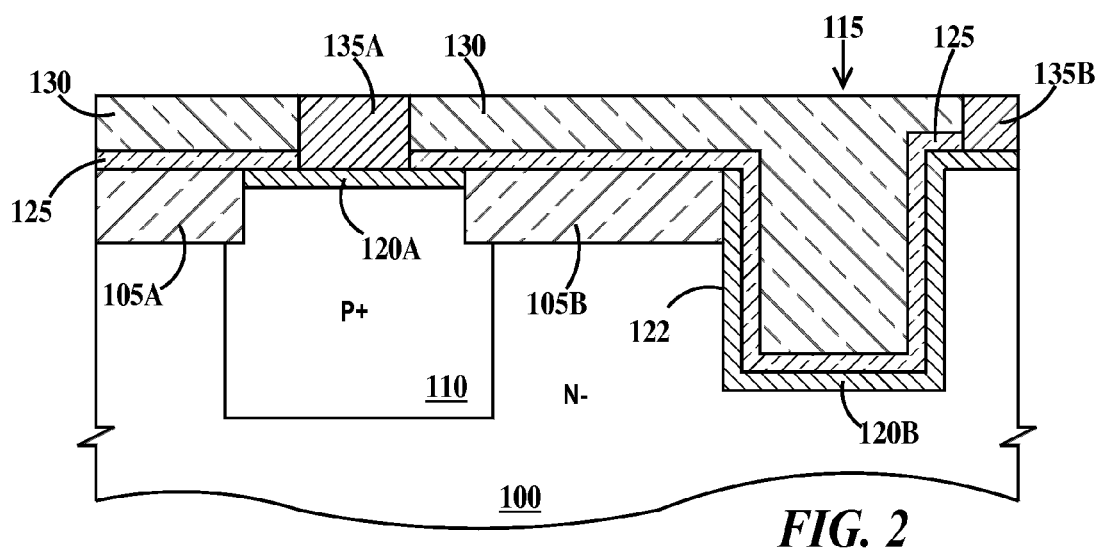
FIG. 2 is a cross-sectional view of a of a second lateral Schottky barrier diode is according an embodiment of the present invention.

FIG. 2 is a cross-sectional view of a of a second lateral Schottky barrier diode is according an embodiment of the present invention. FIG. 2 is similar to FIG. 1E, except substrate 100 is lightly doped N-type and doped region 110 is highly doped P-type. In one example, substrate 100 has an average concentration of phosphorus or arsenic of about 1E16 atm/cm$^3$ or less. In one example, doped region 110 has a dopant concentration of between about 1E17 atm/cm$^3$ and about 1E20 atm/cm$^3$. In one example, doped region 110 is formed by ion implantation of boron or a boron containing species. In one example, doped region 110 is formed simultaneously with a reach-through diffusion of a PNP bipolar transistor. In one example, doped region 110 is formed simultaneously with a P-well diffusion of an n-channel field effect transistor (NFET). In one example, the concentration of dopant in doped region 110 is at least about 10 times greater than a dopant concentration of substrate 100.

Silicide layer 120B, on a sidewall 122 of trench 115 (the sidewall of the trench opposing doped region 110) comprises the cathode of a Schottky barrier diode, while doped region 110 comprises the anode of the Schottky barrier diode. The structure illustrated in FIG. 2 may be fabricated in a manner similar to the structure illustrated in FIG. 1E and described supra.

Figure 3A:
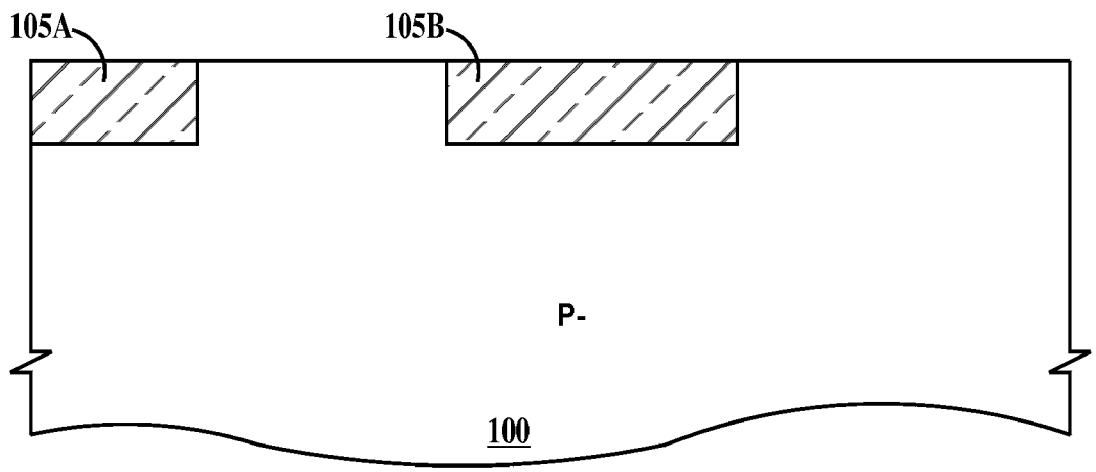
FIGS. 3A through 3F are cross-sectional views illustrating fabrication of a third lateral Schottky barrier diode is according an embodiment of the present invention.
Figure 3B:
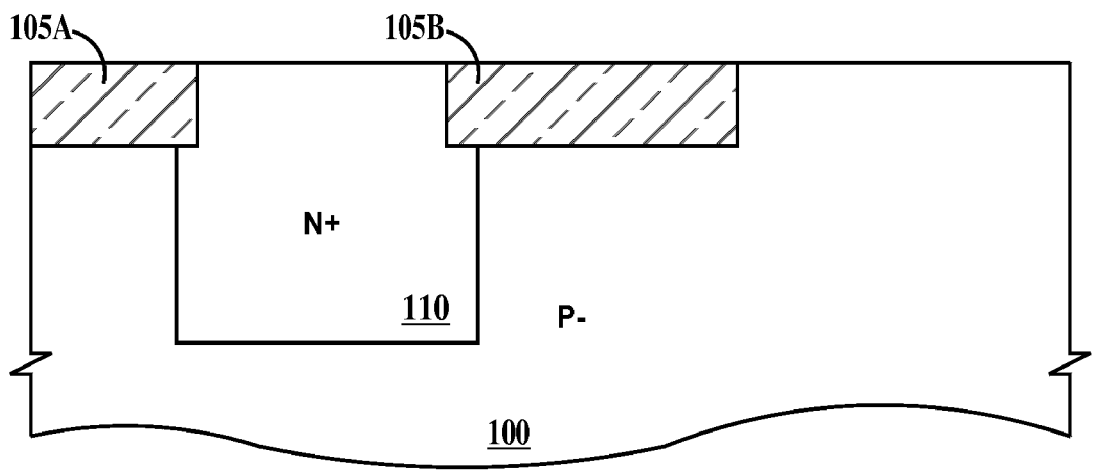
Figure 3C:
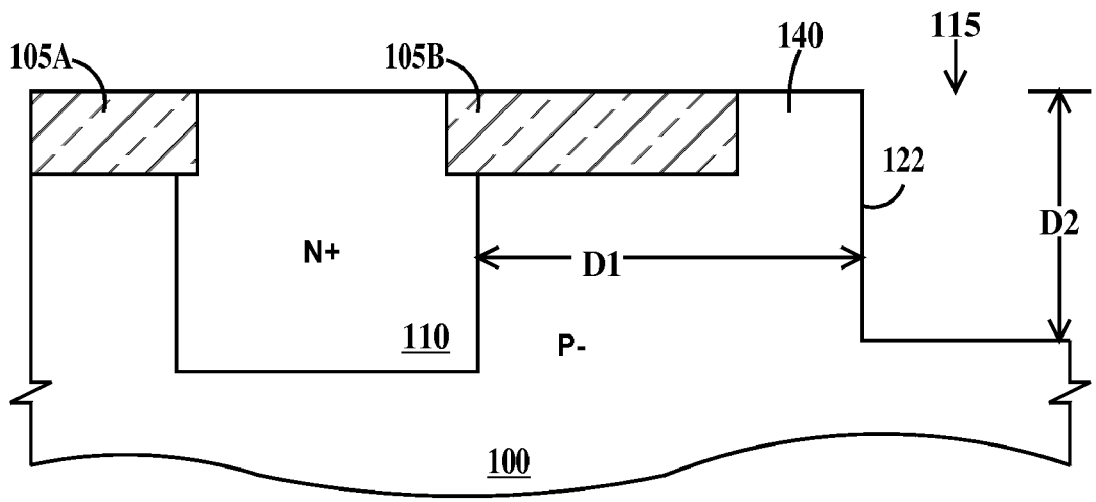

FIGS. 3A through 3F are cross-sectional views illustrating fabrication of a third lateral Schottky barrier diode is according an embodiment of the present invention. FIGS. 3A and 3B are similar to FIGS. 1A and 1B respectively. FIG. 3C differs from FIG. 1C in that trench 115 does not touch STI 105B but a region 140 of substrate 140 intervenes between trench 115 and STI 105B.

Figure 3D:
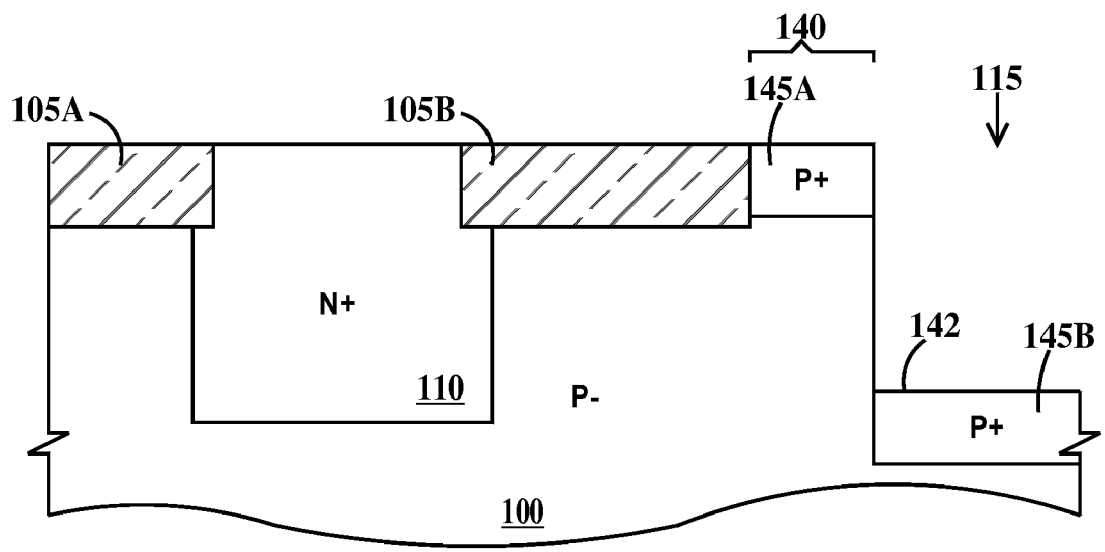

In FIG. 3D, a first guard band 145A is formed in region 140 of substrate 100 and second guard band 145B is formed in substrate 100 under the bottom 146 of trench 115. First and second guard bands 145A and 145B are highly dope P-type. In one example, first and second guard bands 145A and 145B have a dopant concentration of between about 1E18 atm/cm$^3$ and about 1E20 atm/cm$^3$. In one example, first and second guard bands 145A and 145B are formed by ion implantation of boron or a boron containing species. In one example, first and second guard bands 145A and 145B are formed simultaneously with a source/drain diffusion of a PFET. In one example, the concentration of dopant in guard bands 145A and 145B is at least about 10 times greater than a dopant concentration of substrate 100.

Figure 3E:
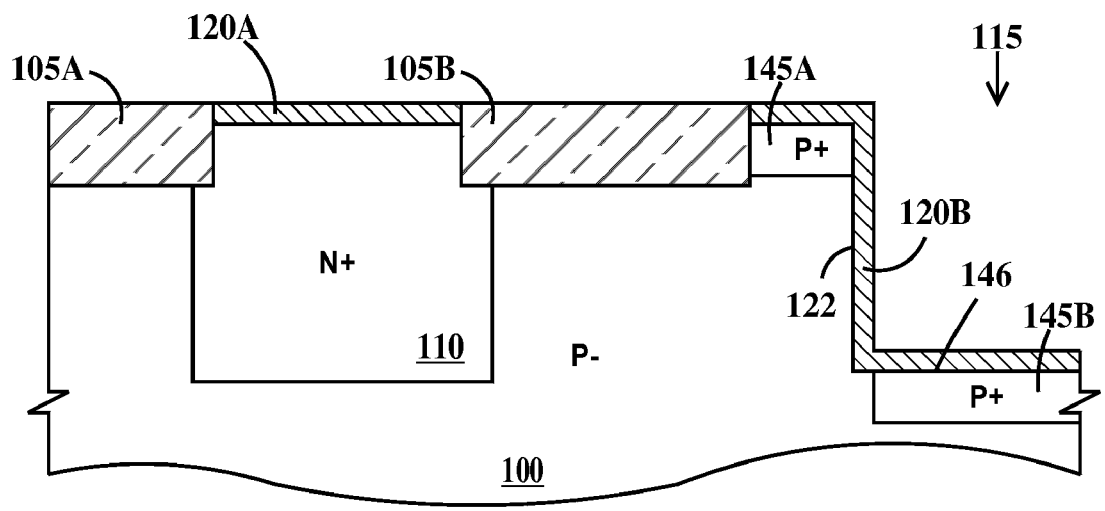

In FIG. 3E, first metal silicide layer 120A is formed on all exposed surfaces of doped region 110 and second metal silicide layer 120B is formed on all silicon surfaces exposed in trench 115. Silicide layers 120A and 120B have been described supra. Silicide layer 120B, on a sidewall 122 of trench 115 (the sidewall of the trench opposing doped region 110) comprises the anode of a Schottky barrier diode, while doped region 110 comprises the cathode of the Schottky barrier diode.

Figure 3F:
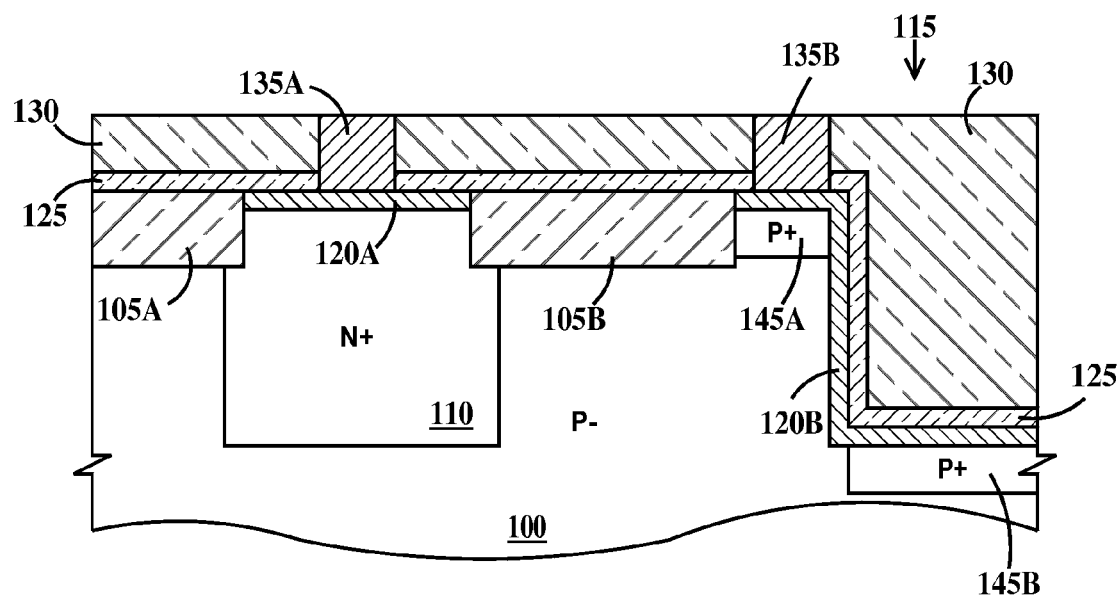

In FIG. 3F, conformal first dielectric layer 125 is deposited and second dielectric layer 130 deposited on top of the first dielectric layer. Dielectric layers 125 and 130 have been described supra. Stud contacts 135A and 135B are then formed. Stud contacts 135A and 135B have been described supra.

FIG. 2 is similar to FIG. 1E, except substrate 100 is lightly doped N-type and doped region 110 is highly doped P-type. In one example, substrate 100 has an average concentration of phosphorus or arsenic of about 1E16 atm/cm$^3$ or less. In one example, doped region 110 has a dopant concentration of between about 1E17 atm/cm$^3$ and about 1E20 atm/cm$^3$. In one example, doped region 110 is formed by ion implantation of boron or a boron containing species. In one example, doped region 110 is formed simultaneously with a reach-through diffusion of a PNP bipolar transistor. In one example, doped region 110 is formed simultaneously with a P-well diffusion of an n-channel field effect transistor (NFET). Silicide layer 120B, on a sidewall 122 of trench 115 (the sidewall of the trench opposing doped region 110) comprises the cathode of a Schottky barrier diode, while doped region 110 comprises the anode of the Schottky barrier diode. The structure illustrated in FIG. 2 may be fabricated in a manner similar to the structure illustrated in FIG. 1E and described supra.

Figure 4:
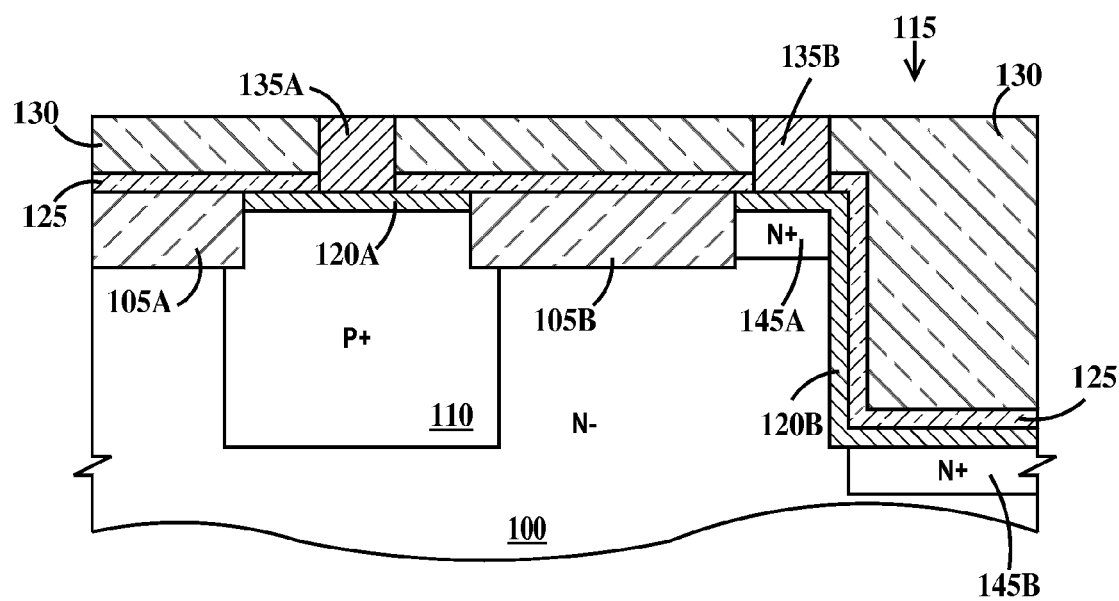
FIG. 4 is a cross-sectional view of a of a fourth lateral Schottky barrier diode is according an embodiment of the present invention.

FIG. 4 is a cross-sectional view of a fourth lateral Schottky barrier diode is according an embodiment of the present invention. FIG. 4 is similar to FIG. 3F, except substrate 100 is lightly doped N-type, doped region 110 is highly doped P-type and guard bands 145A and 145B are highly doped P-type. In one example, substrate 100 has an average concentration of phosphorus or arsenic of about 1E16 atm/cm$^3$ or less. In one example, doped region 110 has a dopant concentration of between about 1E17 atm/cm$^3$ and about 1E20 atm/cm$^3$. In one example, guard bands 145A and 145B have a dopant concentration of between about 1E18 atm/cm$^3$ and about 1 E20 atm/cm$^3$. In one example, doped region 110 is formed by ion implantation of boron or a boron containing species. In one example, doped region 110 is formed simultaneously with a reach-through diffusion of a PNP bipolar transistor. In one example, doped region 110 is formed simultaneously with a P-well diffusion of an n-channel field effect transistor (NFET). In one example, guard bands 145A and 145B are formed simultaneously with source/drains of PFET. Silicide layer 120B, on a sidewall 122 of trench 115 comprises the cathode of a Schottky barrier diode, while doped region 110 comprises the anode of the Schottky barrier diode. The structure illustrated in FIG. 4 may be fabricated in a manner similar to the structure illustrated in FIG. 3F and described supra.

Plan or top views of the Schottky diodes illustrated in FIGS. 1E, 2, 3F and 4 may comprise parallel bar shaped region diffused regions 110, STI 105B, guard band 145A and dielectric filled trench 115 ((see FIG. 4). More efficient layouts are possible as illustrated in FIGS. 5A and 5B.

Figure 5A:
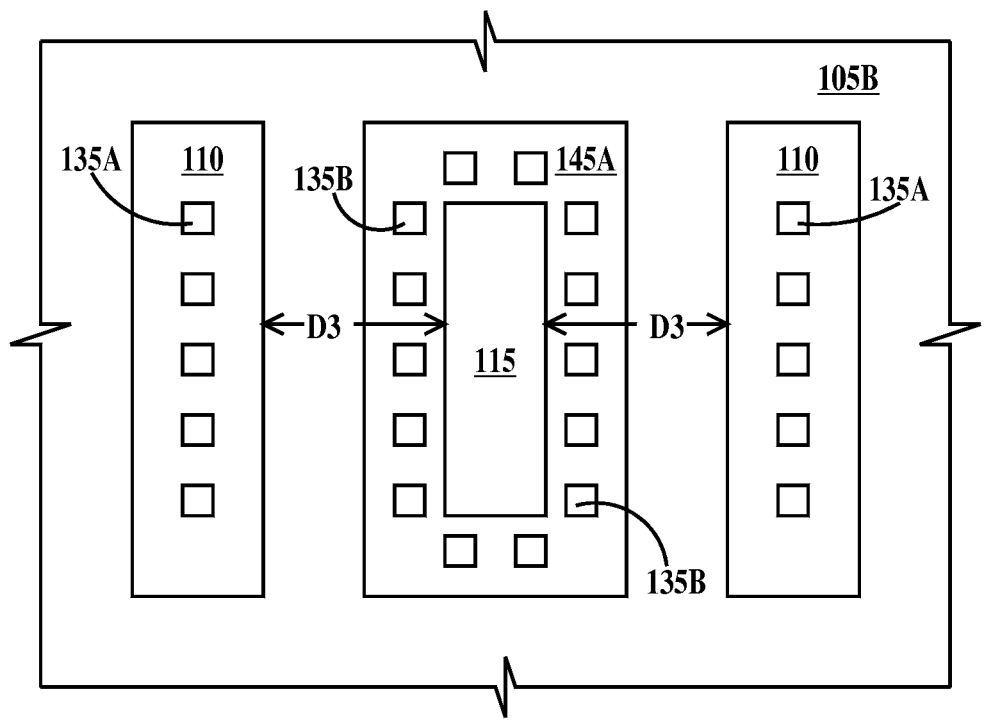
FIG. 5A is a first plan view of Schottky barrier diodes according to embodiments of the present invention.

FIG. 5A is a first plan view of Schottky barrier diodes according to embodiments of the present invention. In FIG. 5A, dielectric filled trench 115 is surrounded by a ring shaped guard band 145A. Two bar shaped doped regions 110 are separated from guard ring 145A by STI 105B. A multiplicity of contacts 135A are placed in each doped region 110 and a multiplicity of contacts 135B are placed in guard band 145A. The distance D3 is the width of the diode between the cathode and anode. D3 is equal to D1 (described supra) minus the amount of silicon consumed by formation of the metal silicide layer 120B (see FIG. 4).

Figure 5B:
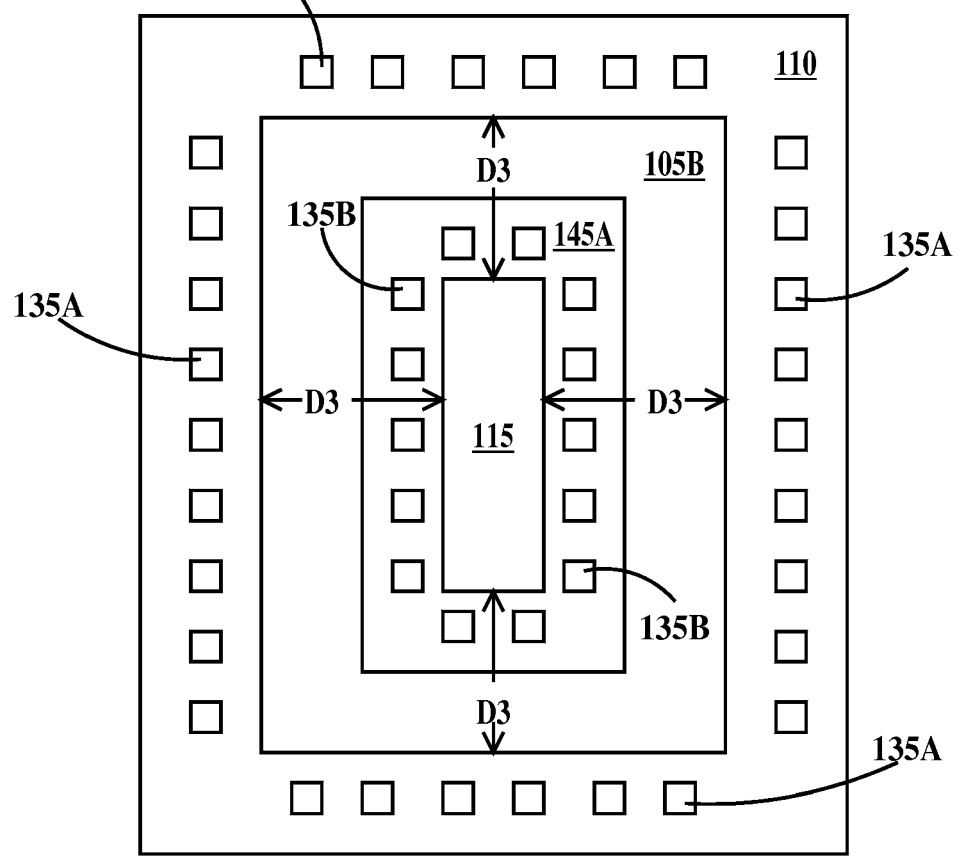
FIG. 5B is a second plan view of Schottky barrier diodes according to embodiments of the present invention.

FIG. 5B is a second plan view of Schottky barrier diodes according to embodiments of the present invention. In FIG. 5B, dielectric filled trench 115 is surrounded by a ring shaped guard ring 145A. A ring shaped doped region 110 is separated from guard ring 145A by a ring of STI 105B. A multiplicity of contacts 135A are placed in each doped region 110 and a multiplicity of contacts 135B are placed in guard band 145A. The distance D3 is the width of the diode between the cathode and anode. D3 is equal to D1 (described supra) minus the amount of silicon consumed by formation of the metal silicide layer 120B (see FIG. 4).

Figure 6A:
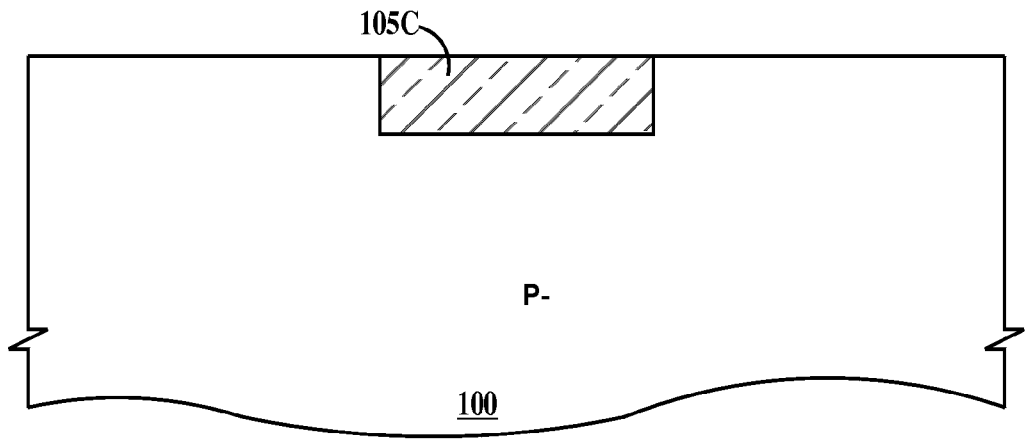
FIGS. 6A through 6F are cross-sectional views illustrating fabrication of a fifth lateral Schottky barrier diode is according an embodiment of the present invention.
Figure 6B:
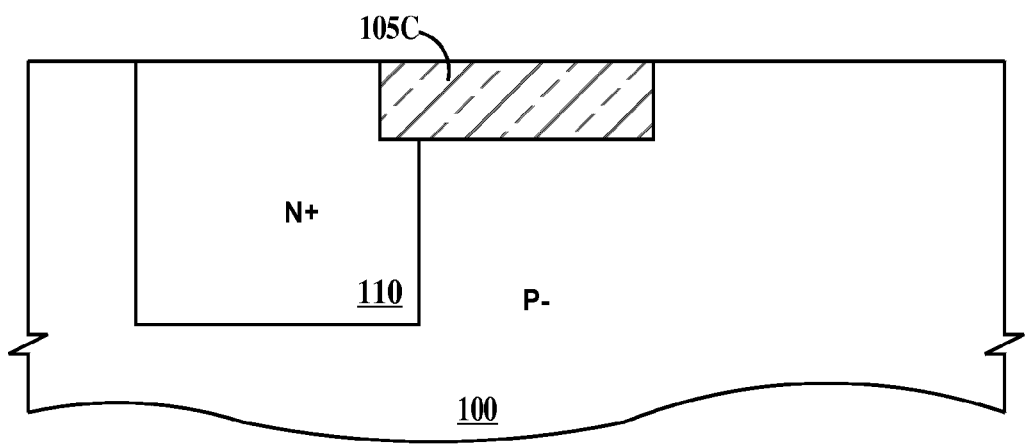
Figure 6C:
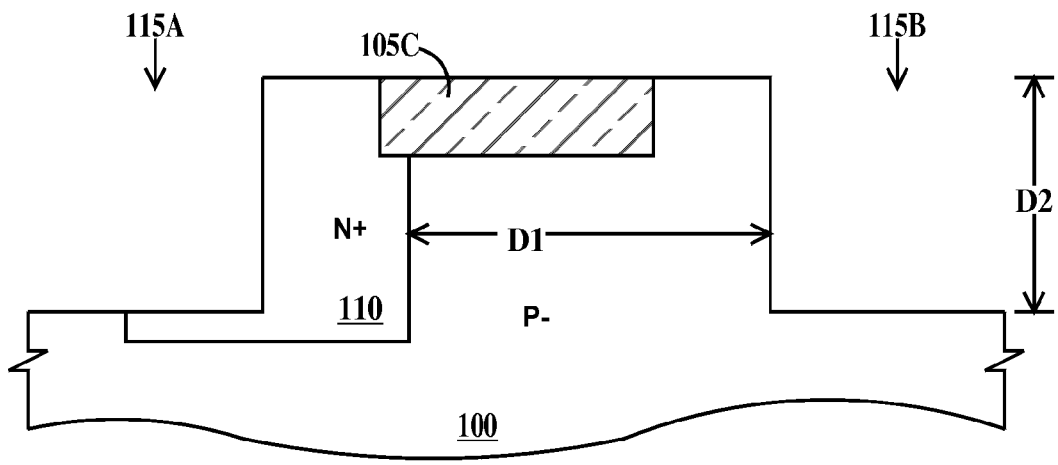
Figure 6D:
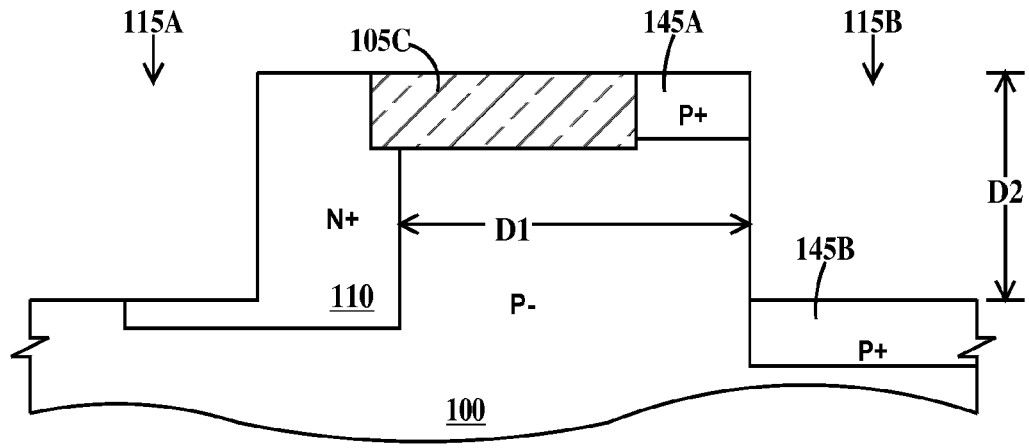
Figure 6E:
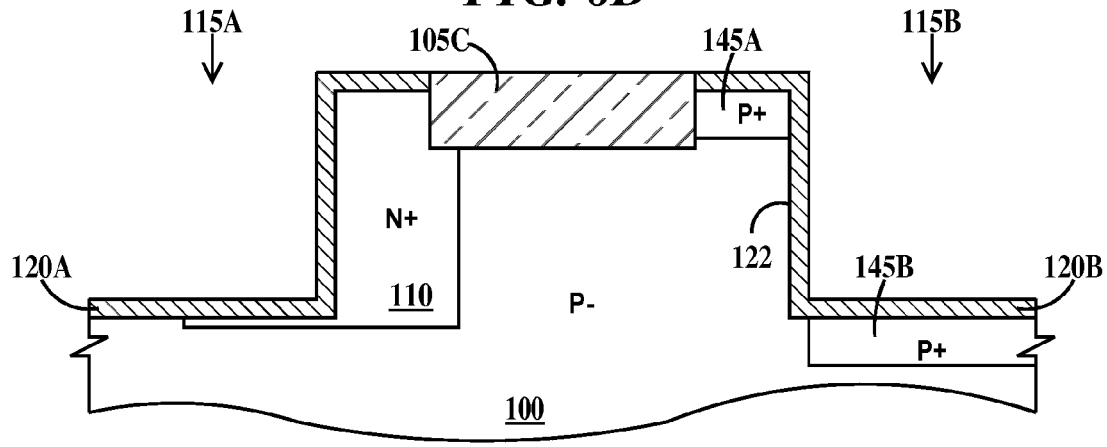

FIGS. 6A through 6F are cross-sectional views illustrating fabrication of a fifth lateral Schottky barrier diode is according an embodiment of the present invention. FIG. 6A is similar to FIG. 3A, except only STI 105C replaces STI 105A and 105B in substrate 100. FIG. 6B is similar to FIG. 3B, except doped region 110 abuts STI 105C. FIG. 6C is similar to FIG. 3C except FIG. 6C includes a first trench 115A and a second trench 115B. Second trench 115B is similar to trench 115 of FIG. 3C and first trench 115A is formed through a portion of doped region 110 as well as a portion of substrate 100. FIG. 6D is similar to FIG. 3D, with guard bands 145A and 145B being formed as described supra. FIG. 6E is similar to FIG. 3E, except first silicide layer 120A is formed on all exposed surfaces of first doped region 110 and first trench 115A. While doped region 110 extends under trench 115A in FIG. 6E, alternatively, trench 115A may extend completely through doped region 110. Silicide layer 120B, on a sidewall 122 of trench 115B (the sidewall of the trench opposing doped region 110) comprises the anode of a Schottky barrier diode, while doped region 110 comprises the cathode of the Schottky barrier diode.

Figure 6F:
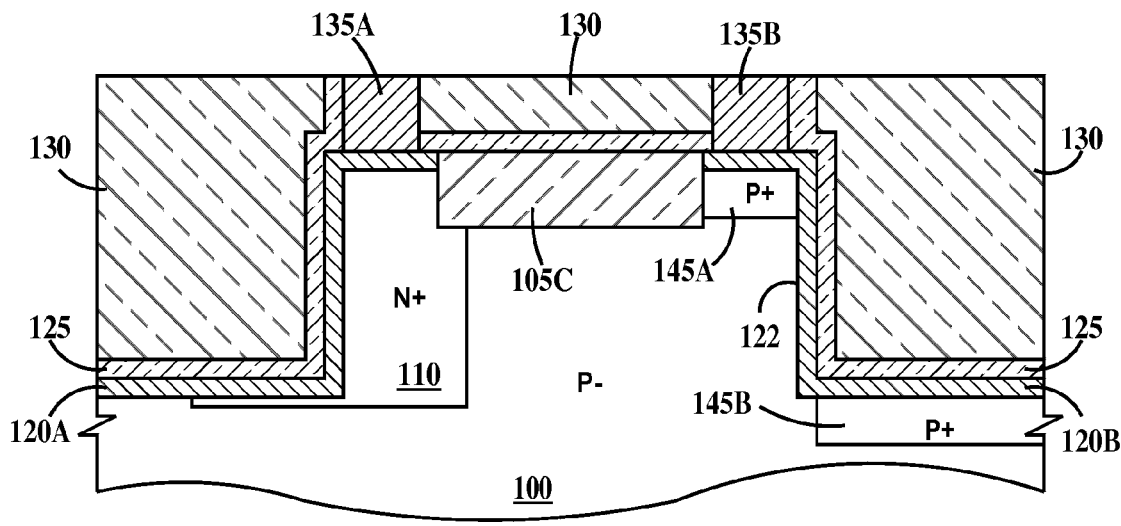

In FIG. 6F, conformal first dielectric layer 125 is deposited and second dielectric layer 130 deposited on top of the first dielectric layer. Dielectric layers 125 and 130 have been described supra. Stud contacts 135A and 135B are then formed. Stud contacts 135A and 135B have been described supra.

In a sixth lateral Schottky barrier diode, substrate 100 is lightly doped N-type, diffused region 110 is highly doped N-type and guard bands 145A and 145B are highly doped P-type as described supra for Schottky barrier diodes of FIGS. 2 and 4.

While the fifth and sixth lateral Schottky barrier diodes are described using a guard band (e.g. 145A and 145B), respective seventh and eighth lateral Schottky barrier diodes may be fabricated using dual trenches (e.g. 115A and 115B) but not using a guard band, simply by etching two trenches during the fabrication step illustrated in FIG. 1A and described supra.

Figure 7A:
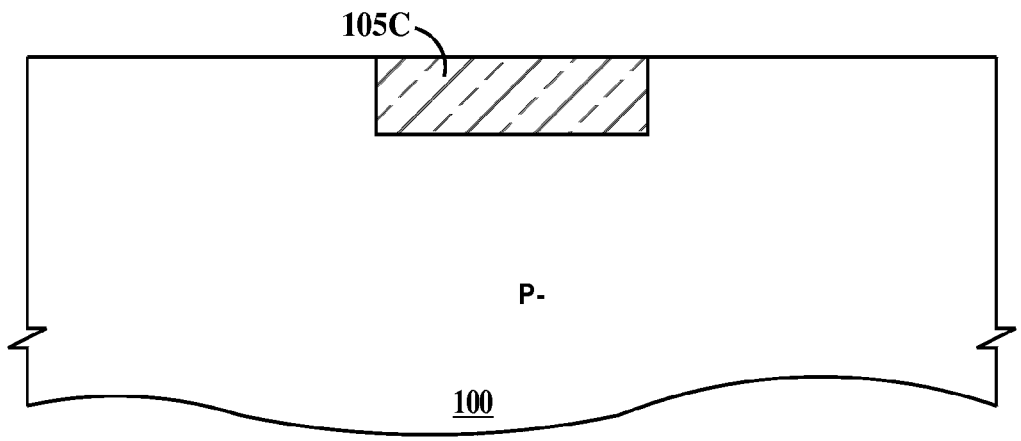
FIGS. 7A through 7F are cross-sectional views illustrating fabrication of a lateral PIN diode is according an embodiment of the present invention.

FIGS. 7A through 7F are cross-sectional views illustrating fabrication of a lateral PIN diode is according an embodiment of the present invention. In FIG. 7A, formed in a bulk silicon substrate (or alternatively a lightly doped silicon epitaxial layer) 100 is a region of STI 105C. Substrate 100 is lightly doped P-type. In one example, substrate 100 has an average concentration of boron or a boron containing species of about 1E16 atm/cm$^3$ or less. STI 105C is similar to STI 105A and 105B of, for example, FIG. 1A described supra.

Figure 7B:
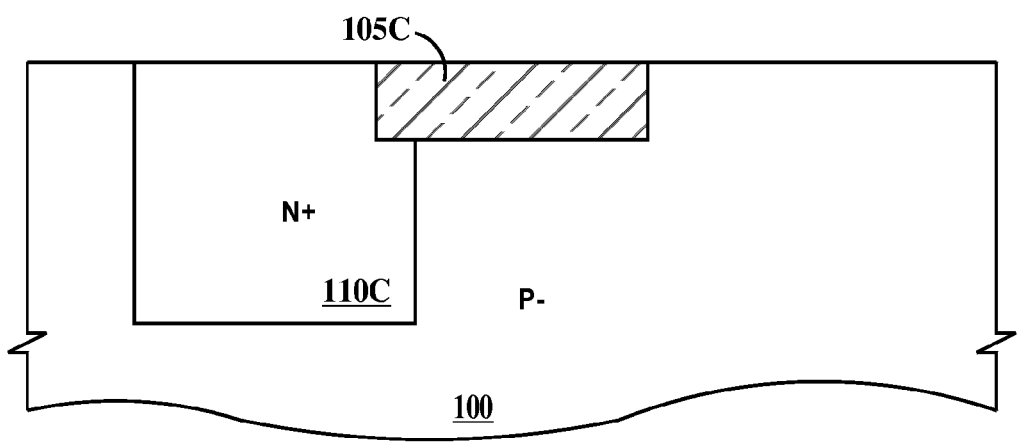

In FIG. 7B a first doped region 110C is formed in substrate 100. First doped region 110C is a highly doped N-type. First doped region 110C is bounded on one side by STI 105C. In one example, first doped region 110C has a dopant concentration of between about 1E17 atm/cm$^3$ and about 1E20 atm/cm$^3$. In one example, the concentration of dopant in first doped region 110C is at least about 10 times greater than a dopant concentration of substrate 100. In one example, first doped region 110C is formed by ion implantation of arsenic or phosphorous. In one example, first doped region 110C is formed simultaneously with a reach-through diffusion of an NPN bipolar transistor. In one example, first doped region 110C is formed simultaneously with an N-Well diffusion of a p-channel field effect transistor (PFET).

Figure 7C:
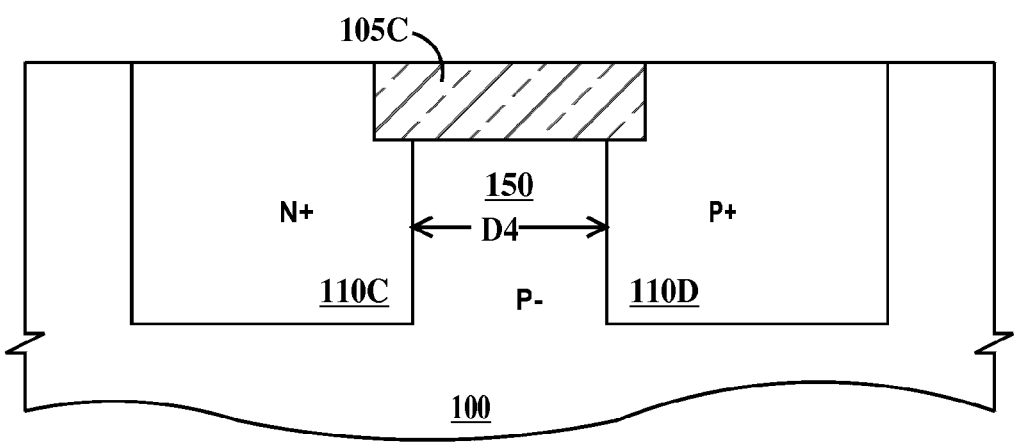

In FIG. 7C a second doped region 110D is formed in substrate 100. Second doped region 110D is a highly doped N-type. Second doped region 110D is bounded on one side by STI 105C. A region 150 of substrate 100 under STI 105C separates first doped region 110C from second doped region 110D. Region 150 has a width D4. In one example, second doped region 110D has a dopant concentration of between about 1E17 atm/cm$^3$ and about 1E20 atm/cm$^3$. In one example, the concentration of dopant in second doped region 110D is at least about 10 times greater than a dopant concentration of substrate 100. In one example, second doped region 110D is formed by ion implantation boron or boron containing species. In one example, second doped region 110D is formed simultaneously with a reach-through diffusion of a PNP bipolar transistor. In one example, second doped region 110B is formed simultaneously with a P-Well diffusion of an NFET.

Figure 7D:
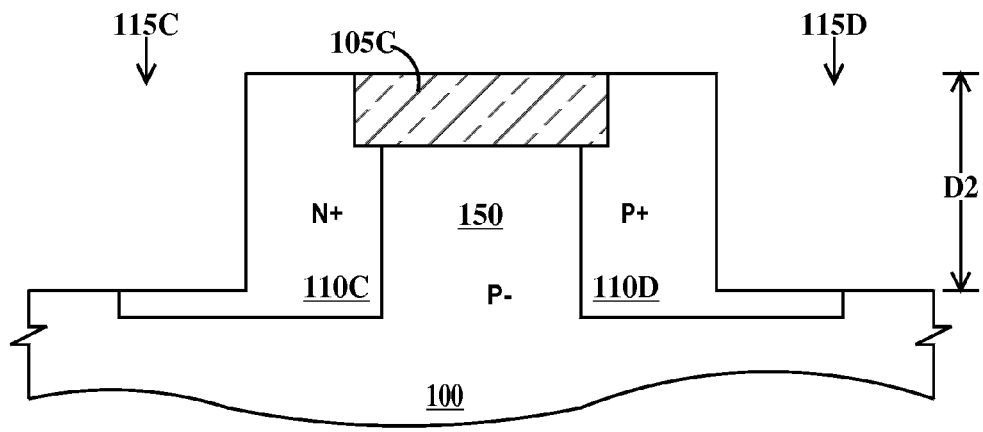

In FIG. 7D, a first trench 115C (similar to first trench 115A of FIG. 6C is formed through a portion of doped region 110C as well as a portion of substrate 100 and a second trench 115D (similar to second trench 115B of FIG. 6C is formed through a portion of second doped region 110D as well as a portion of substrate 100.

Figure 7E:
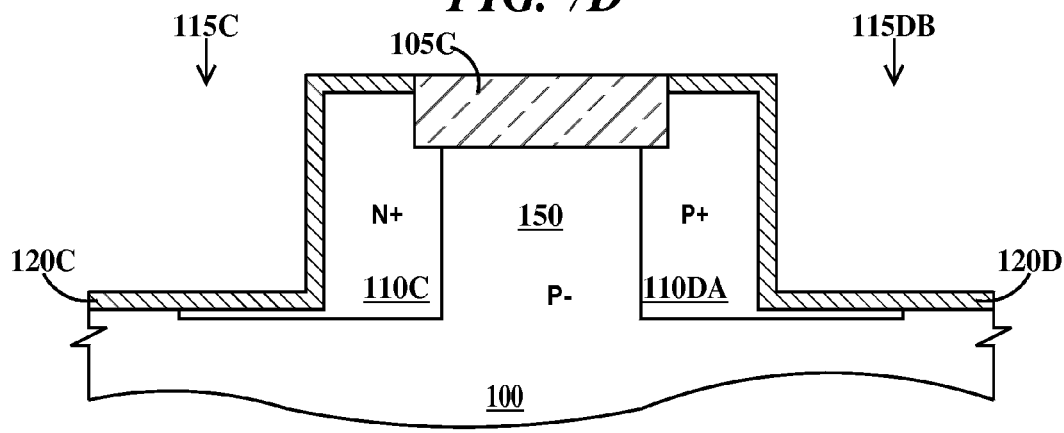

In FIG. 7E, a first silicide layer 120C is formed on all exposed surfaces of first doped region 110C and first trench 115C. A second silicide layer 120D is formed on all exposed surfaces of first doped region 110D and first trench 115D. Silicide layers 120C and 120D are formed simultaneously. Formation of silicide layers has been described supra. While first doped region 110C extends under first trench 115C in FIG. 6E, alternatively, first trench 115C may extend completely through first doped region 110C. While second doped region 110D extends under second trench 115D in FIG. 6E, alternatively, second trench 115D may extend completely through second doped region 110D. First doped region 110C comprises the cathode (the "N" of "PIN") and second doped region 110D comprises the anode (the "P" of "PIN") of a PIN diode. Region 150 comprises the "I" in "PIN" of a PIN diode.

Figure 7F:
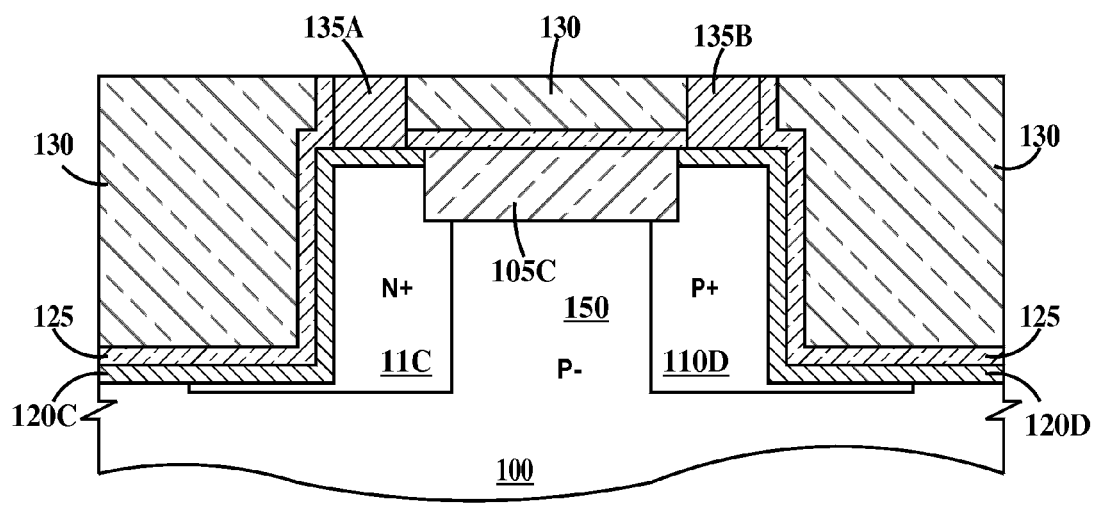

In FIG. 7F, conformal first dielectric layer 125 is deposited and second dielectric layer 130 deposited on top of the first dielectric layer. Dielectric layers 125 and 130 have been described supra. Stud contacts 135A and 135B are then formed. Stud contacts 135A and 135B have been described supra.

FIG. 8 is a cross-sectional view illustrating a method of further isolating Schottky barrier and PIN diodes according to the various embodiments of the present invention. FIG. 8, is illustrated with the fifth lateral Schottky diode (see FIG. 6F) but any of the lateral Schottky diodes and the PIN diode described supra may be similarly further isolated. In FIG. 8, first and second dielectric filled trenches 115A and 115B are shown in complete cross-section. First trench 115A and second trench 115B are bounded by an STI region 105E. A deep trench 155 extends under STI region 105E into substrate 155 deeper than the depth of either doped region 110 or guard band 145B.

FIG. 9A is a simple diagram of a field effect transistor (FET) and FIG. 9B is a simple diagram of a bipolar transistor. In FIGS. 9A and 9B the major elements of FETs and bipolar transistors are illustrated.

The lateral Schottky barrier diodes and lateral PIN diode of the various embodiments of the present invention may be fabricated together in the same substrate or integrated circuit chip will now be described.

Figure 10A:
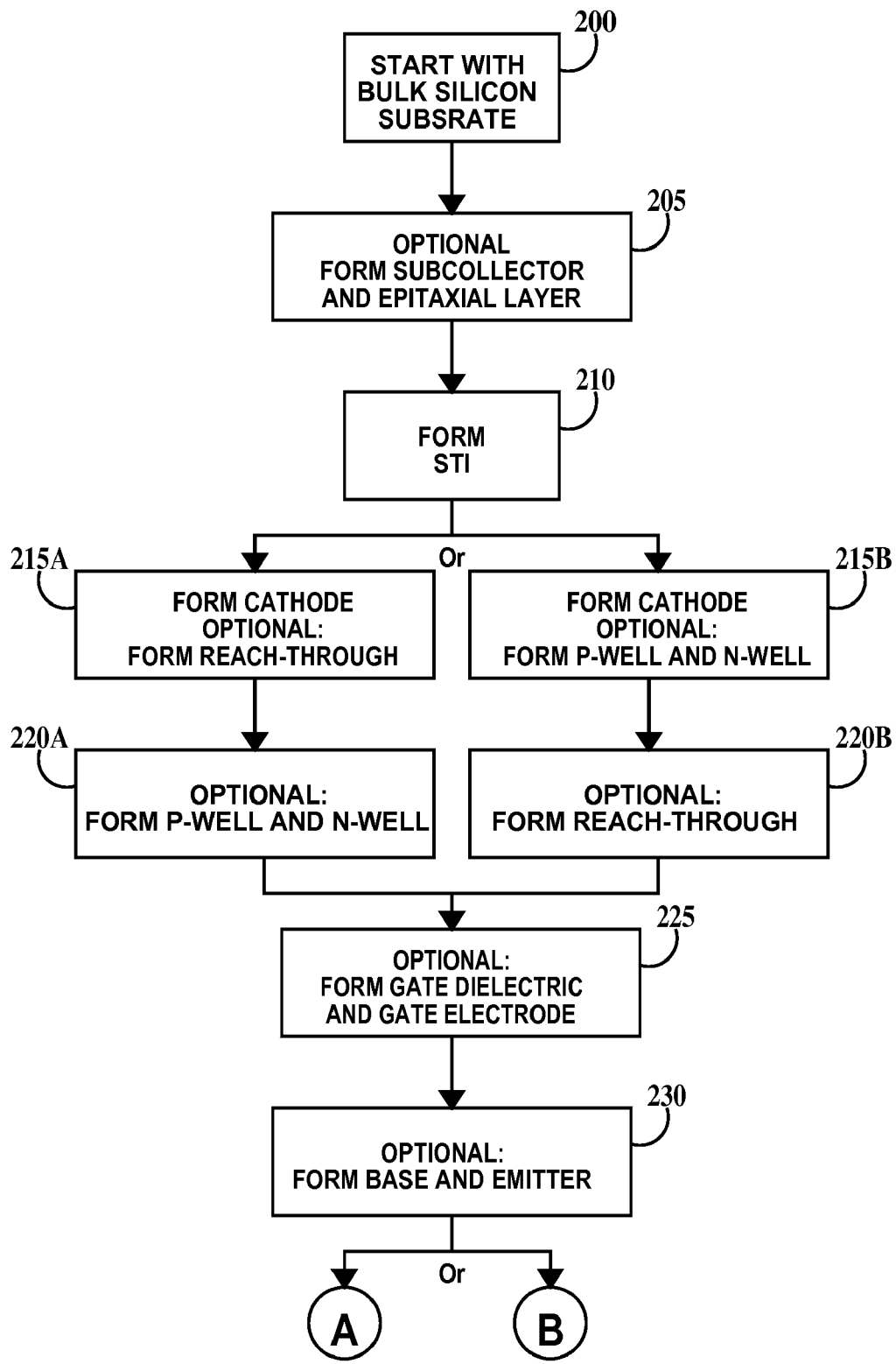
FIGS. 10A through 10C are flowcharts illustrating integration of the fabrication of Schottky barrier and PIN diodes according to the various embodiments of the present invention with FET's and bipolar transistors.
Figure 10B:
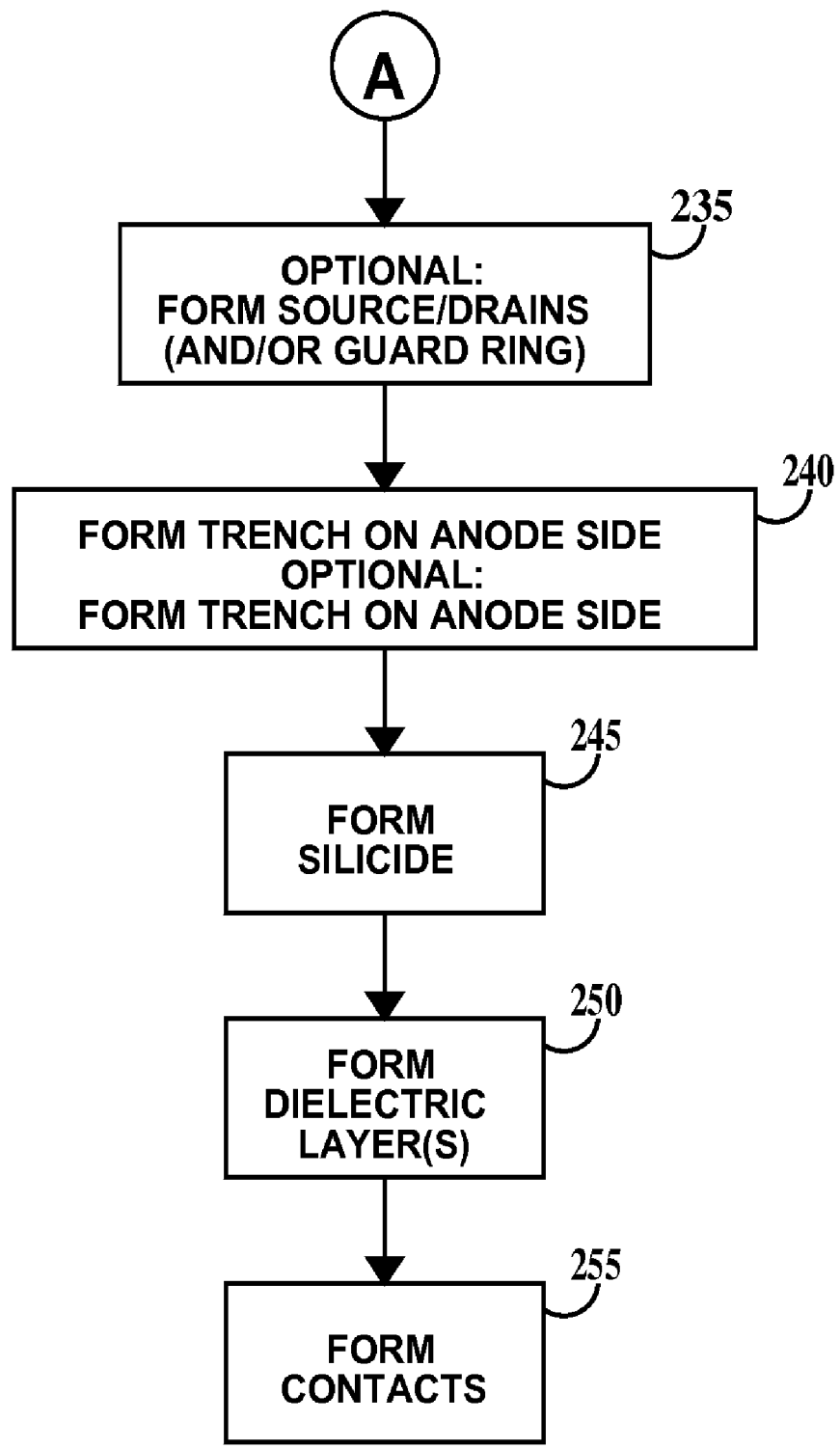

FIG. 10A through 10B are flowcharts illustrating integration of the fabrication of Schottky barrier and PIN diodes according to the various embodiments of the present invention with FETs and bipolar transistors. In step 200, a bulk silicon substrate is provided. In one example, the silicon substrate is undoped or has a P-type dopant concentration of about 1E16 atm/cm$^3$ or less.

In optional step 205, subcollectors of bipolar transistors may be formed in the substrate and an epitaxial silicon layer grown on the substrate. In one example, the epitaxial layer is undoped or has a P-type dopant concentration of about 1E16 atm/cm$^3$ or less. Hereafter, the term "substrate" means the bulk silicon substrate if step 205 is not performed and the epitaxial layer if step 205 is performed.

In step 210, STI is formed. Alternatively, a patterned dielectric layer may be formed on the surface of the substrate. Two fabrication options now present themselves. In the first option, in step 215A the cathodes (or anodes) of diodes are formed. The cathodes (or anodes) may be formed alone, simultaneously with reach-throughs to the subcollectors of bipolar transistor or the cathodes (or anodes) and reach-throughs may be formed separately. Then in optional step 220A, the P-well and N-wells of NFETs and PFETs may be formed. In the second option, in step 215B the cathodes (or anodes) of the diodes are formed. The cathodes (or anodes) may be formed alone, simultaneously with the N-wells of PFETs (cathodes) or the P-wells of NFETs (anodes) or the cathodes (or anodes) and P-wells and N-wells may be formed separately. Then in optional step 220B, reach-throughs to subcollectors of bipolar transistors may be formed.

In one example, the cathodes (or anodes) have a dopant concentration of between about 1E18 atm/cm$^3$ and about 5E20 atm/cm$^3$.

Both steps 225 and 230 are optional. In step 225 the gate dielectric and gate electrodes of PFETs and NFETs are formed and in step 230, the bases and emitters of bipolar transistors may be formed. Formation of the bases and emitters includes formation of the bases and emitters of SiGe bipolar transistors, which have more complicated base and emitter structures than conventional bipolar transistors.

Figure 10C:
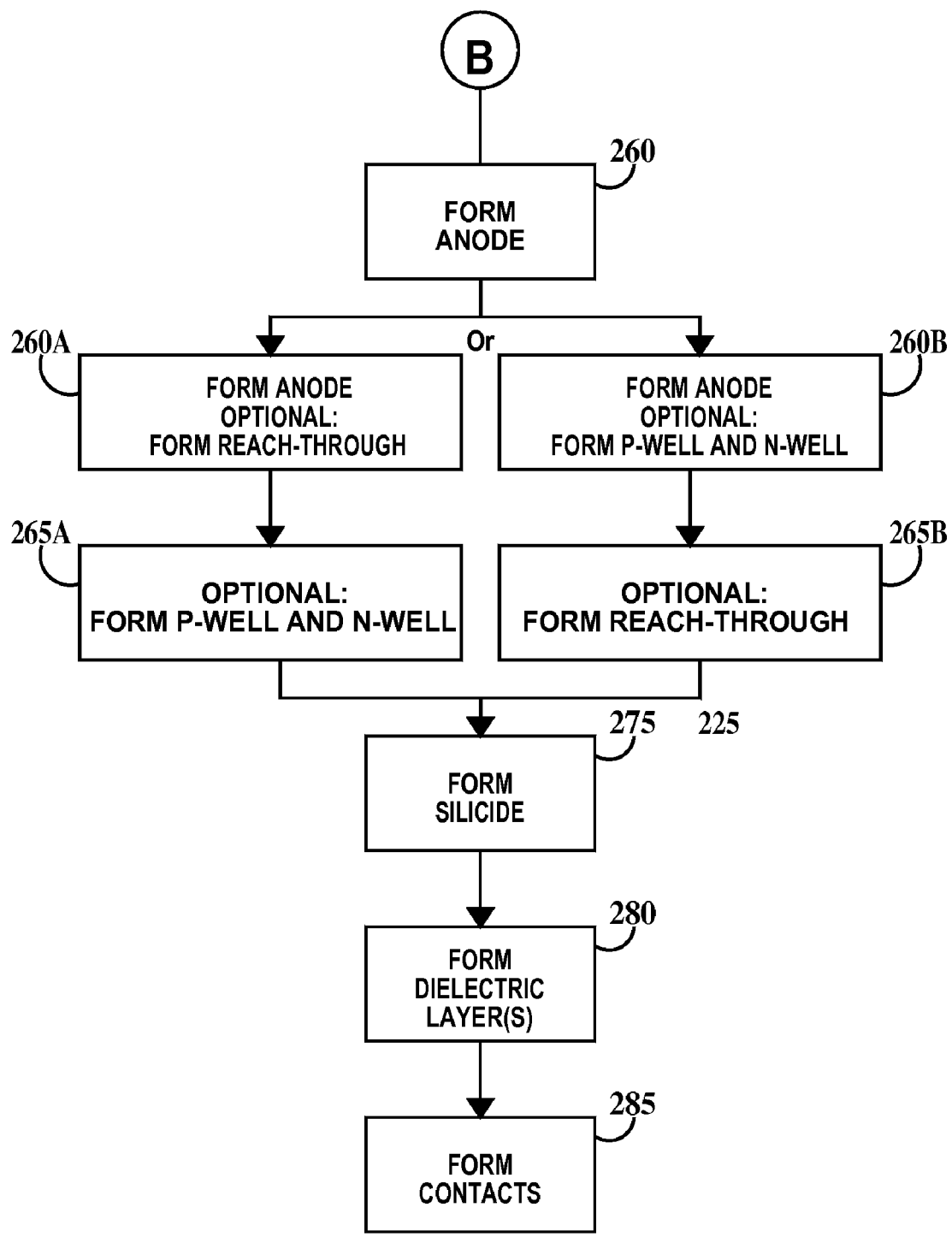

The method now branches to connector "A" or connector "B". Connector "A" leads to FIG. 10B and connector "B" leads to FIG. 10C. FIG. 10B illustrates the further steps to fabricate a lateral Schottky barrier diode and FIG. 10C illustrates the further steps to fabricate a lateral PIN diode.

Turning to FIG. 10B, in optional step 235, only guard rings are formed, only the source/drains of NFETs and PFETs are formed or guard rings and the source/drains of NFETs and PFETs are formed simultaneously. In one example, guard rings have a dopant concentration of between about 1E17 atm/cm$^3$ and about 1E20 atm cm$^3$.

In step 240, a trench is formed on the anode (cathode) side of the diodes. Optionally, a second trench is formed on the cathode (anode) sides of the diode.

In step 245, metal silicide layers are formed on all exposed silicon surfaces of the cathodes (or anodes) and trenches to complete the lateral Schottky barrier diode.

In step 250, one or dielectric layers are formed and in step 255 contacts are formed through the one or more dielectric layers to the silicide layers contacting the cathode (or anodes) and the silicide layer forming the anodes (or cathodes) of the lateral Schottky barrier diode. Contacts may also be made to any NFETs, PFETs and bipolar transistor that were fabricated along with the lateral Schottky barrier diode.

Turning to FIG. 10C, two fabrication options now present themselves. In the first option, in step 260A the anodes of diodes are formed. The anodes may be formed alone, simultaneously with reach-throughs to the subcollectors of bipolar transistor or the anodes and reach-throughs may be formed separately. Then in optional step 265A, the P-well and N-wells of NFETs and PFETs may be formed. In the second option, in step 260B the anodes of the diodes are formed. The anodes may be formed alone, simultaneously with the P-wells of NFETs or the anodes and P-wells may be formed separately. Then in optional step 265B, reach-throughs to subcollectors of PNP bipolar transistors may be formed.

In one example, the anodes (or cathodes) have a dopant concentration of between about 1E18 atm/cm$^3$ and about 5E20 atm/cm$^3$.

In step 270, a trench is formed on the anode side of the diodes.

In step 275, metal silicide layers are formed on all exposed silicon surfaces of the cathodes, anodes and trenches to complete the lateral PIN diode.

In step 280, one or dielectric layers are formed and in step 285 contacts are formed through the one or more dielectric layers to the silicide layers contacting the cathode and anodes the lateral PIN diode. Contacts may also be made to any NFETs, PFETs and bipolar transistor that were fabricated along with the lateral PIN diodes.

Thus, the embodiments of the present invention provide improved Schottky barrier and PIN diodes, methods of fabricating improved Schottky barrier and PIN diodes and methods of integrating improved Schottky barrier and PIN diodes into CMOS, bipolar and BiCMOS technologies.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, STI may be replaced by substantially thinner dielectric layers or layer formed on the surface rather than below the surface of the substrate. Additionally, Schottky barrier diodes and PIN diodes may be fabricated together in the same substrate or integrated circuit chip. Therefore, it is intended that the following claims cover all such modifications and changes as fall within the true spirit and scope of the invention.

What is claimed is:

1. A method of fabricating a diode, comprising:

forming doped region in a silicon substrate, said doped region having opposite first and second sides, said doped region extending from a top surface of said substrate a first distance into said substrate;

forming a trench in said substrate, said trench having opposite first and second sidewalls and extending from said top surface of said substrate a second distance into said substrate, said first sidewall of said trench separated from said first side of said doped region by a dielectric region extending from said top surface of said substrate a third distance into said substrate and by a region of said substrate under said dielectric region and between said first side of said doped region and said first sidewall of said trench, said third distance less than said first or second distances; and forming a first region of a metal silicide layer on said first sidewall of said trench and forming a second region of said metal silicide layer on a top surface of said doped region, said first and second regions of said metal silicide layer electrically isolated from each other by said dielectric region.

2. The method of claim 1, further including:

filling said trench with a dielectric layer and covering said metal silicide layer with said dielectric region;

forming a first electrically conductive contact in said dielectric layer, said first electrically conductive contact extending from a top surface of said dielectric layer, through said dielectric layer to said first region of said metal silicide layer, said first electrically conductive contact in direct physical and electrical contact with said first region of said metal silicide layer; and forming a second electrically conductive contact in said dielectric layer, said a second electrically conductive contact extending from said top surface of said dielectric layer, through said dielectric layer to said second region of said metal silicide layer, said second electrically conductive contact in direct physical and electrical contact with said second region of said metal silicide layer.

3. The method of claim 1, wherein said first region of said metal silicide layer extends over a bottom and said second sidewall of said trench, a region of said top surface of said substrate abutting said second sidewall of said trench.

4. The method of claim 1, wherein said dielectric region abuts said first sidewall of said trench.

5. The method of claim 1, further including:
forming a first additional doped region in said substrate, said first additional doped region extending from said top surface of said substrate a fourth distance into said substrate, said first additional doped region between and abutting both said dielectric region and said first sidewall of said trench;
forming a second additional doped region in said substrate, said second additional doped region extending from said bottom of said trench said fourth distance into said substrate, said first additional and second additional doped regions doped to an opposite type from that of said first doped region, a dopant concentration of said first and second additional doped regions at least about 10 times greater than a dopant concentration of said substrate; and
said second region of said metal silicide layer extending over exposed surfaces of said first and second additional doped regions.

6. The method of claim 5, further including:
forming and additional trench in said substrate, said additional trench having opposite first and second sidewalls and extending from said top surface of said substrate said second distance into said substrate, said first sidewall of said additional trench abutting said second side of said doped region; and
said second region of said metal silicide layer extending over said second side of said doped region exposed in said additional trench and over a bottom surface of said additional trench.

7. The method of claim 6, further including filling said additional trench with said dielectric layer.

8. The method of claim 1, further including:
forming an additional trench in said substrate, said additional trench having opposite first and second sidewalls and extending from said top surface of said substrate said second distance into said substrate, said first sidewall of said additional trench abutting said second side of said doped region; and
said second region of said metal silicide layer extending over said second side of said doped region exposed in said second trench and a bottom surface of said additional trench.

9. The method of claim 8, further including filling said additional trench with said dielectric layer.

10. The method of claim 1, wherein said metal silicide is selected from the group consisting of tungsten silicide, molybdenum silicide, tantalum silicide, cobalt silicide, titanium silicide, nickel silicide and platinum silicide.

11. The method of claim 1, wherein:
said doped region is doped N-type and said substrate is doped P-type or is intrinsic, a concentration of dopant in said doped region at least about 10 times greater than a dopant concentration of said substrate; or
said doped region is doped P-type and said substrate is doped N-type or is intrinsic, a concentration of dopant in said doped region at least about 10 times greater than a dopant concentration of said substrate.

12. The method of claim 1, further including simultaneously with fabricating said diode, fabricating a field effect transistor, a bipolar transistor a SiGe bipolar transistor or combinations thereof in said substrate.

13. A method of fabricating a diode, comprising:
forming a first doped region in a silicon substrate, said first doped region having opposite first and second sides, said first doped region extending from a top surface of said substrate a first distance into said substrate;
forming a second doped region in said substrate, said second doped region having opposite first and second sides, said second doped region extending from said top surface of a silicon substrate a second distance into said substrate, said first and second doped regions separated by a dielectric region extending from said top surface of said substrate a third distance into said substrate and by a region of said substrate under said dielectric layer and between said first sides of said first and second doped regions, said first side of said first doped region opposite said first side of said second doped region, said third distance less than said first or second distances;
forming a first trench in said substrate, said first trench having opposite first and second sidewalls and extending from said top surface of said substrate a fourth distance into said substrate, said first sidewall of said first trench abutting said second side of said first doped region;
forming a second trench in said substrate, said second trench having opposite first and second sidewalls and extending from said top surface of said substrate said fourth distance into said substrate, said first sidewall of said second trench abutting said second side of said second doped region; and
forming a first region of a metal silicide layer on a top surface of said first doped region and on said second side of said first doped region and forming a second region of said metal silicide layer on a top surface of said second doped region and on said second side of said second doped region, said first and second regions of said metal silicide layer electrically isolated from each other by said dielectric region.

14. The method of claim 13, further including:
filling said first and second trenches and covering said metal silicide layer and said dielectric region with a dielectric layer;
forming a first electrically conductive contact in said dielectric layer, said first electrically conductive contact extending from a top surface of said dielectric layer, through said dielectric layer to said first region of said metal silicide layer, said first electrically conductive contact in direct physical and electrical contact with said first region of said metal silicide layer; and
forming a second electrically conductive contact in said dielectric layer, said second electrically conductive contact extending from said top surface of said dielectric layer, through said dielectric layer to said second region of said metal silicide layer, said second electrically conductive contact in direct physical and electrical contact with said second region of said metal silicide layer.

15. The method of claim 13, wherein said first region of said metal silicide layer extends over a bottom of said first trench and said second region of said metal silicide layer extends over a bottom of said second trench.

16. The method of claim 13, wherein said metal silicide is selected from the group consisting of tungsten silicide, molybdenum silicide, tantalum silicide, cobalt silicide, titanium silicide, nickel silicide and platinum silicide.

17. The method of claim 13, wherein:
said first doped region is doped N-type, said second doped region is doped P-type and said substrate is doped P-type or is intrinsic, concentration of dopants in respective first and second doped regions at least about 10 times greater than a dopant concentration of said substrate.

18. The method of claim 13, further including simultaneously with fabricating said diode, fabricating a field effect transistor, a bipolar transistor a SiGe bipolar transistor or combinations thereof in said substrate.

* * * * *

UNITED STATES PATENT AND TRADEMARK OFFICE
CERTIFICATE OF CORRECTION

PATENT NO. : 7,335,927 B2
APPLICATION NO. : 11/275794
DATED : February 26, 2008
INVENTOR(S) : Douglas Duane Coolbaugh et al.

It is certified that error appears in the above-identified patent and that said Letters Patent is hereby corrected as shown below:

Column 1, Line 3 please add the following paragraph after the title in the specification:

This invention was made with Government support under Contract No.: N66001-02-C-8014 awarded by Defense Advanced Research Projects Agency (DARPA). The Government has certain rights in this invention.

Signed and Sealed this
Thirtieth Day of April, 2013

Teresa Stanek Rea
*Acting Director of the United States Patent and Trademark Office*